Bottomley et al.

[11] Patent Number: 4,484,138
[45] Date of Patent: Nov. 20, 1984

[54] METHOD OF ELIMINATING EFFECTS OF SPURIOUS FREE INDUCTION DECAY NMR SIGNAL CAUSED BY IMPERFECT 180 DEGREES RF PULSES

[75] Inventors: Paul A. Bottomley, Clifton Park; William A. Edelstein, Schenectady, both of N.Y.

[73] Assignee: General Electric Company, Schenectady, N.Y.

[21] Appl. No.: 394,355

[22] Filed: Jul. 1, 1982

[51] Int. Cl.³ .............................................. G01R 33/08
[52] U.S. Cl. ..................................... 324/307; 324/309
[58] Field of Search ............... 324/300, 307, 311, 313, 324/314, 309

[56] References Cited

U.S. PATENT DOCUMENTS 4,045,723  8/1977  Ernst .................................... 324/309
4,318,043  3/1982  Crooks ................................. 324/309
4,431,968  2/1984  Edelstein et al. .................... 324/309

OTHER PUBLICATIONS

Application S.N. (General Electric Co. Docket RD-13,822) filed concurrently herewith.

Primary Examiner—Michael J. Tokar
Attorney, Agent, or Firm—Lawrence D. Cutter; James C. Davis, Jr.; Marvin Snyder

[57] ABSTRACT

A method for eliminating the effects of a spurious free induction decay (FID) NMR signal due to imperfect 180° RF pulses comprises applying a large magnitude, short duration magnetic field gradient pulse, termed the "crusher" pulse immediately following the 180° pulse. When the method is employed with NMR pulse sequences in which the 180° pulse is part of a spin echo type refocusing RF pulse sequence, the 180° pulse is preceded by a magnetic field gradient pulse termed the "primer", having an equal integral with respect to time as the crusher pulse. The method is effective in removing NMR image artifacts produced by spurious FID in both planar and three-dimensional NMR imaging methods.

34 Claims, 14 Drawing Figures

METHOD OF ELIMINATING EFFECTS OF SPURIOUS FREE INDUCTION DECAY NMR SIGNAL CAUSED BY IMPERFECT 180 DEGREES RF PULSES

BACKGROUND OF THE INVENTION

This invention relates to nuclear magnetic resonance (NMR) methods. More specifically, this invention relates to improved NMR imaging methods which eliminate the effects of spurious free induction decay (FID) NMR signals caused by imperfect 180° radio frequency (RF) pulses.

NMR imaging methods utilize a combination of pulsed magnetic field gradients and pulsed RF magnetic fields to obtain NMR imaging information from nuclear spins situated in a selected region of an imaging sample. The imaging sample is typically positioned in a static magnetic field $B_o$. The effect of field $B_o$ is to polarize nuclear spins having net magnetic moments so that a greater number of the spins align with the field and add to produce a net magnetization M. Individual polarized nuclear spins, and hence magnetization M, resonate (or precess about the axis of field $B_o$) at a frequency $\omega$ given by the equation $$\omega = \gamma B_o, \quad (1)$$

in which $\gamma$ is the gyromagnetic ratio (constant for each NMR isotope).

As will be more fully described hereinafter, magnetic field gradients are necessary to encode spatial information into the NMR signal. If a magnetic field gradient along an imaging volume is a function of position, then so is the frequency $\omega$. In fact, if the imaging gradient is linear, the frequency spectrum is a one-dimensional projection of the NMR signal distribution along the direction of the gradient.

RF magnetic field pulses are directed orthogonal to the $B_o$ field used to excite nuclear spins to resonance. The frequency of the RF pulse needed to induce resonance is the same as the precession frequency defined by equation (1). Two types of RF magnetic field pulses commonly used are 90° and 180° pulses. A 90° RF pulse causes magnetization M to rotate 90° about the axis defined by the applied RF magnetic field vector in a frame of reference rotating at the resonant frequency $\omega$ about the direction of field $B_o$, relative to the laboratory frame of reference. Thus, if the direction of field $B_o$ is assumed to be the positive Z-axis direction of a Cartesian coordinate system, a 90° RF pulse will cause magnetization M along $B_o$ to rotate into the transverse plane defined by the X-and Y-axis, for example. Similarly, a 180° RF pulse causes magnetization M along $B_o$ to rotate 180° about the axis of field $B_o$ (e.g., from the positive Z-axis direction to the negative Z-axis direction).

Nuclear spins rotated 90° into the transverse plane, or through some other angle such that magnetization M has a vectorial component in the transverse plane, will produce an FID NMR signal which is observable upon termination of RF excitation. The FID signal can be detected by a receiver coil positioned to be sensitive along the transverse plane.

A NMR FID signal will not be observed if the nuclear spins are inverted 180° from the direction of the static magnetic field $B_o$, because magnetization M under these conditions does not have a component in the plane of the receiver coil. While this is true for ideal 180° RF pulses, in practice the 180° pulses are rarely ideal, and in virtually all cases a small spurious FID occurs immediately following the 180° pulse. The FID can arise because the 180° RF pulse is not precisely 180°. In some cases, the RF transmitter coils used to irradiate the imaging sample generate inhomogeneous fields so that parts of the imaging sample do not receive precisely a 180° pulse and therefore contribute an FID component in the transverse plane. Some NMR techniques utilize selective 180° RF pulses to invert nuclear spins by 180° in a planar section of an imaging sample, while leaving those spins outside the section substantially unaffected. In this case, regions bordering the planar section of nuclear spins selectively inverted by a 180° RF pulse can actually experience a 90° RF pulse and thereby generate a large FID.

The effect of imperfections in 180° RF pulses on NMR imges can be quite severe. If the spurious FID signal lasts sufficiently long it will add to the desired NMR signal that contains the spatial encoding information. Because the spurious FID signal has different spatial encoding, it generates artifacts in the reconstructed image. In the case of selective 180° pulses, the spurious signal can render the selective 180° RF pulses unusable.

The NMR pulse sequences in accordance with the present invention eliminate the effects of spurious FID NMR signals caused by imperfect 180° RF pulses. The duration of the FID signal is controlled so that it does not appear in the data acquisition period. Although the invention is described with reference to NMR imaging methods, its applicability is not limited thereto. The invention is applicable to other NMR methods in which spurious FID signals, caused by imperfect 180° RF pulses, produce undesirable effects. One such method is the use of selective 180° RF pulses in localized NMR spectroscopy. Another is localized NMR blood flow imaging.

SUMMARY OF THE INVENTION

The effects of spurious FID NMR signals caused by imperfect 180° RF pulses are overcome by the application of a large magnitude, short duration magnetic field gradient pulse immediately following the application of the 180° pulse. The effect of the gradient pulse is to rapidly dephase nuclear spins so that the spurious FID signal does not interfere with a desired NMR signal during the data acquisition interval.

When applied to spin echo pulse sequences, the 180° RF pulse is preceded by another gradient pulse with an equal integral with respect to time as the pulse which is applied immediately after the 180° pulse.

It is an object of the invention to provide improved NMR methods which eliminate the effects of spurious FID NMR signals produced by imperfect 180° RF pulses.

It is another object of the invention to provide improved NMR imaging pulse sequences for eliminating image artifacts due to spurious FID NMR signals caused by imperfect 180° RF pulses.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
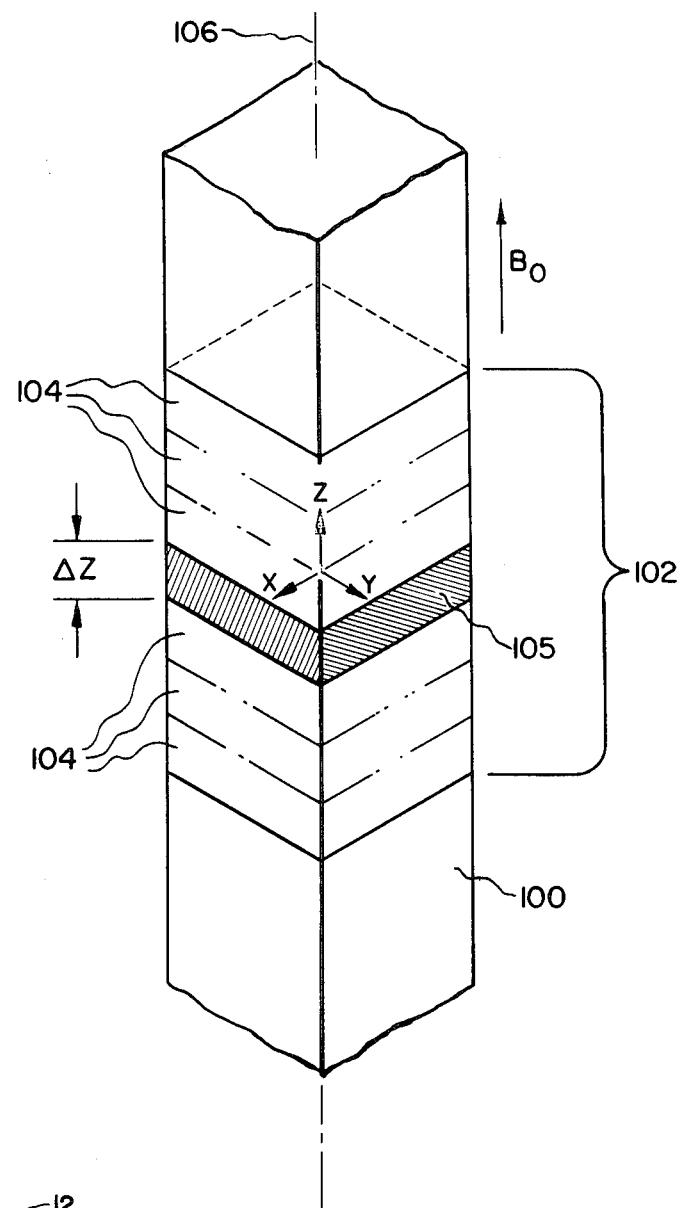
FIG. 1 illustrates an NMR imaging sample situated in a static magnetic field and having a planar imaging volume defined therein by selective excitation.

The NMR imaging pulse sequences produced by the invention will be best understood if initial reference is made to FIG. 1 which depicts an imaging sample 100 situated in a static homogeneous magnetic field $B_o$ directed in the positive Z-axis direction of the Cartesian coordinate system. The Z-axis is selected to be coincident with the long or cylindrical axis 106 of sample 100. The origin of the coordinate system is taken to be the center of the imaging sample, which is also at the center of a thick planar slab or imaging volume 102 selected by the selective excitation method, as will be described hereinafter. Thinner planar slices or imaging volumes 104 and 105 correspond to a series of tomographic images obtainable upon analysis of the three-dimensional spatial information obtained by the NMR pulse sequence depicted in FIG. 8. A single planar image corresponding to section 105, for example, can be constructed using the spatial information obtained with the use of the pulse sequences depicted in FIGS. 3, 6, and 7. Each of these pulse sequences will be described hereinafter in greater detail. Typically, thickness $\Delta z$ of a planar slice 104 or 105 is approximately 2 to 15 millimeters.

Figure 2:
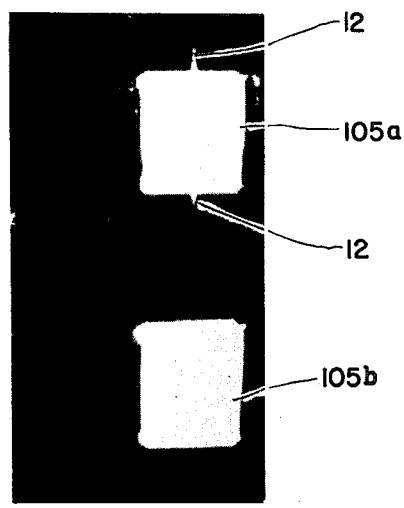
Fig. 2 is a photograph depicting an NMR image at 105a exhibiting streak artifacts, and an NMR image at 105b in which the streak artifacts have been eliminated with the use of the invention.

FIG. 2 depicts photographically two NMR section images 105a and 105b each corresponding to section 105 in sample 100 (FIG. 1), in this case selected to be a water-filled bottle to simulate living tissue which is typically characterized by high water content. Images 105a and 105b represent the distribution of protons (hydrogen nuclei) in slice 105 of the water filled bottle, and hence show a uniform distribution of protons.

Figure 3:
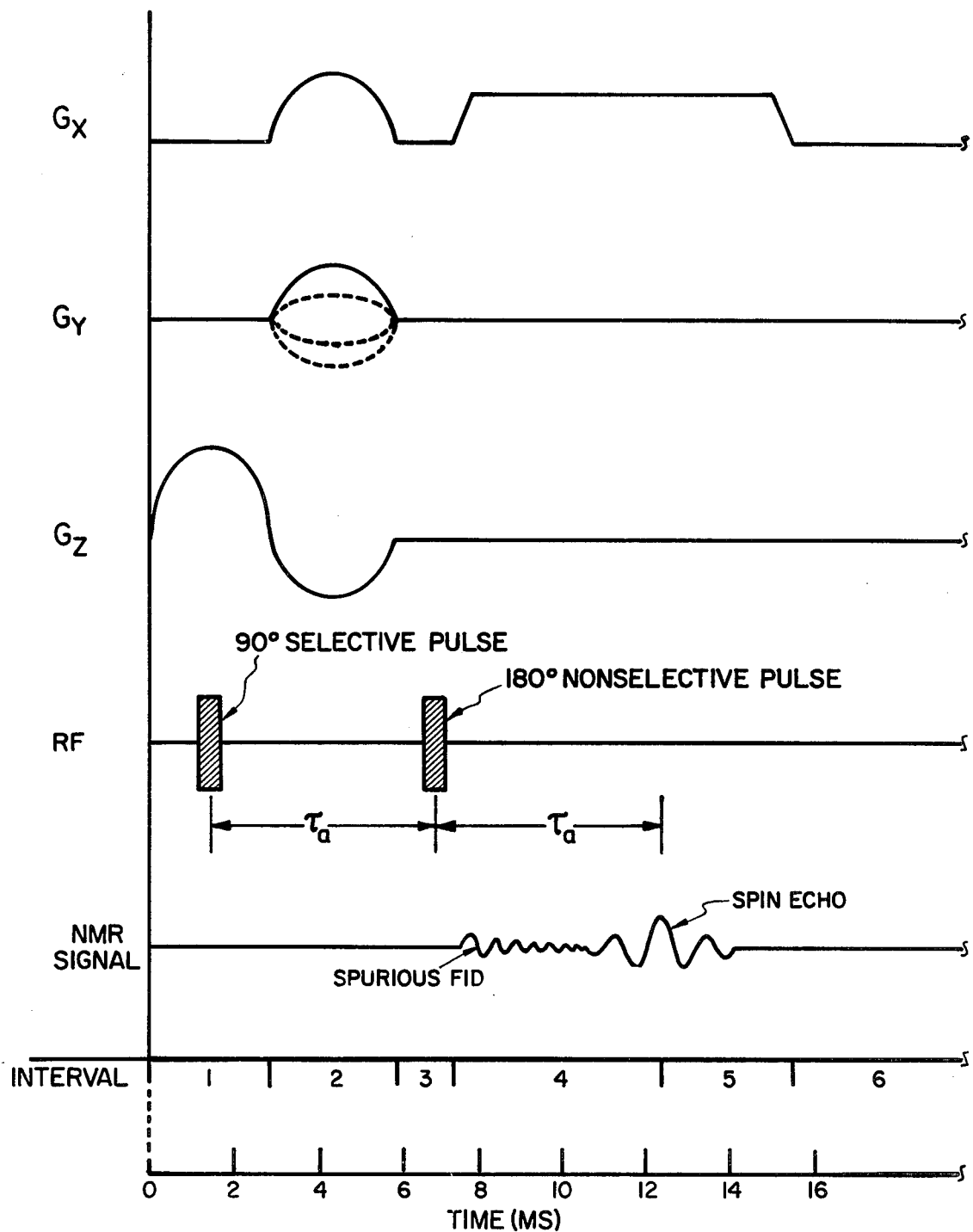
Fig. 3 illustrates an NMR imaging sequence used to produce the imaging data for image 105a in FIG. 2.

Image 105a, constructed from imaging information obtained by the use of the NMR pulse sequence shown in FIG. 3, exhibits streak artifacts 12 attributable to spurious FID NMR signals (during interval 4, FIG. 3) caused by imperfect 180° RF pulses (during interval 3, FIG. 3). In contrast, image 105b was constructed using pulse sequences (FIG. 6) incorporating the present invention, as will be described hereinafter. It is evident that image 105b is free of artifacts 12.

In order to better appreciate the present invention, the pulse sequence depicted in FIG. 3 will be described first. In this pulse sequence, as in others described herein, the imaging sample is positioned in a static magnetic field $B_o$, which field is accordingly omitted from all of the figures depicting NMR pulse sequences. In addition, in each pulse sequence field gradients are necessary to produce spatial localization of the NMR signal. Typically, three such gradients are necessary:

$$G_x(t) = \partial B_o/\partial x \qquad (2)$$
$$G_y(t) = \partial B_o/\partial y \qquad (3)$$
$$G_z(t) = \partial B_o/\partial z \qquad (4)$$

The $G_x$, $G_y$, and $G_z$ gradients are constant throughout the imaging volume 105, (FIG. 1), but their magnitudes are typically time dependent. The magnetic fields associated with the gradients are denoted, respectively, $b_x$, $b_y$, and $b_z$, wherein $$b_x = G_x(t)x \qquad (5)$$
$$b_y = G_y(t)y \qquad (6)$$
$$b_z = G_z(t)z \qquad (7)$$

within the imaging volume.

Selection of planar section 105 of nuclear spins is accomplished during interval 1 shown on the horizontal axis of FIG. 3. In this interval, a positive magnetic field gradient $G_z$ is applied so that the imaging sample 100 (FIG. 1) is subjected to a total magnetic field in the Z-axis direction composed of the gradient $G_z$ and static magnetic field $B_o$. Approximately at the midpoint of interval 1, the sample is irradiated with a selective 90° RF pulse with a frequency content selected so as to preferentially excite nuclear spins in planar section 105 (FIG. 1) in which the magnetic field strength is as predicted by equation (1). Nuclear spins outside region 105 remain substantially unaffected by this RF pulse. The "selective" nature of the 90° RF pulse is thus apparent.

The 90° RF pulse (schematically illustrated in FIG. 3 as a shaded rectangle) is preferably a carrier amplitude modulated by a signal of waveform (sin bt)/bt, in which t is time and b is a constant. In this case the thickness profile of section 105 is substantially rectangular. Alternatively, other frequency selective 90° RF pulses can be used. For example, the RF pulse may be modulated to have a Gaussian shaped envelope. In this case, section 105 will have a Gaussian profile.

At the end of interval 1 (FIG. 3), nuclear spins in planar section 105 have been rotated into the transverse plane, and although they precess at the same frequency, they are out of phase with one another due to the dephasing effect of $G_z$ during the second half of interval 1.

The nuclear spins are rephased in interval 2 by the application of a negative $G_z$ gradient related to the positive G gradient in interval 1 such that $$\int_2 dt G_z = -\tfrac{1}{2} \int_1 dt G_z, \qquad (8)$$

where $\int_2$ is the integral with respect to time of the waveform of gradient $G_z$ over interval 2 and $\int_1$ is the integral with respect to time of the waveform of gradient $G_z$ over interval 1.

Simultaneously with the application of the negative $G_z$ gradient in interval 2, a phase encoding $G_y$ gradient having one of $n_y$ different amplitudes (as indicated by the dashed lines) is applied. The $G_y$ gradient encodes spatial information in the Y-axis direction by introducing a twist in the orientation of the nuclear spins by an integal multiple of $2\pi$ over the total length of the sample 100 in the Y-axis direction. Following the application to sample 100 in the Y-axis direction of the first phase encoding gradient, the nuclear spins are twisted into a one-turn helix. Each different amplitude of gradient $G_y$ introduces a different degree of twist (phase encoding). The number, $n_y$, of $G_y$ gradient amplitudes is chosen to be equal to the number of pixels the reconstructed image will have in the Y-axis direction. The pulse sequence of FIG. 3 is repeated for $n_y$ different amplitudes of gradient $G_y$ to produce $n_y$ NMR spin echo signals in interval 5. In practice, the signals are averaged several times prior to advancing the $G_y$ gradient in order to improve the signal-to-noise ratio. Typically $n_y$ is 128 or 256.

Also in interval 2, a positive $G_x$ magnetic field gradient is applied to dephase nuclear spins in the X-axis direction by a predetermined amount. The 180° RF pulse applied in interval 3 reverses the direction of nuclear spin dephasing so that the nuclear spins again rephase and produce the NMR spin-echo signal (intervals 4 and 5) which can be observed at a time when the imaging gradient $G_x$ is constant. In the absence of the dephasing gradient and the 180° RF pulse, the NMR signal would occur at sometime near the end of interval 2 and the beginning of interval 3. It would be difficult to obtain useful spatial information from such an NMR signal because there would be a finite time period when imaging gradient $G_x$ is transient and its exact strength unknown. The resulting spatial information would be badly distorted and could not be normally used.

If the 180° RF pulse in interval 3 is applied (following a short time interval of between 0.1 and 1 millisecond to allow current in the gradient winding to subside) at a time $\tau_a$ following the application of the selective 90° RF pulse (wherein $96_a$ is the time period between the mean application of the 90° and 180° RF pulses, typically about 5 milliseconds), and the $G_x$ gradient in intervals 2 and 4 is selected such that $$\int_2 G_x dt = \int_4 G_x dt, \qquad (9)$$

then the resultant spin echo signal is the sum of two spin echo signal components. The first of the two signal components is due to the rephasing of the nuclear spins dephased by inherent inhomogeneities in the static magnetic field $B_o$. The spins rephase and produce a spin-echo signal at a period $\tau_a$ following the application of the 180° RF pulse. The second spin echo signal componet is due to the reversal of the nuclear spins dephased in interval 2 (by gradient $G_x$) which also rephase and produce a spin echo signal at time interval $\tau_a$ after the application of the 180° RF pulse, provided the condition of equation (9) is satisfied. The method for overcoming the effects of the inhomogeneities in the static field $B_o$ is described and claimed in application Ser. No. 345,444, filed Feb. 3, 1982 by the same inventors as herein and assigned to the same assignee as the present invention. This patent application is incorporated herein by reference.

Although magnetic field gradient $G_x$ is depicted in interval 2 as the positive half of a sinusoid, it can be of any shape, provided equation (9) is satisfied. For example, gradient $G_x$ could also have a Gaussian or rectangular configuration.

To introduce spatial discrimination in the X-axis direction, the nuclear spin echo in intervals 4 and 5 is sampled (in quadrature) $n_x$ times during this time interval in the presence of the imaging $G_x$ gradient, where $n_x$ is typically equal to $n_y$ and is equal to the number of pixels the image has in the x-axis direction. Upon analysis by known discrete, two-dimensional Fourier transform methods, imaging section 105 is divided into $n_x \cdot n_y$ pixels, which can be used to construct an image such as image 105a in FIG. 1.

It is to be noted that the NMR spin echo signal also contains a contribution due to a spurious FID signal caused by the imperfect 180° RF pulse applied in interval 3. The spurious FID occurs immediately following application of the 180° RF pulse in interval 3, and may extend (as shown) into intervals 4 and 5 during which the spin echo signal is sampled. The spurious FID signal accounts for streak artifacts 12 shown in FIG. 2.

An exemplary time scale is shown parallel to the horizontal axis in FIG. 3.

Figure 4:
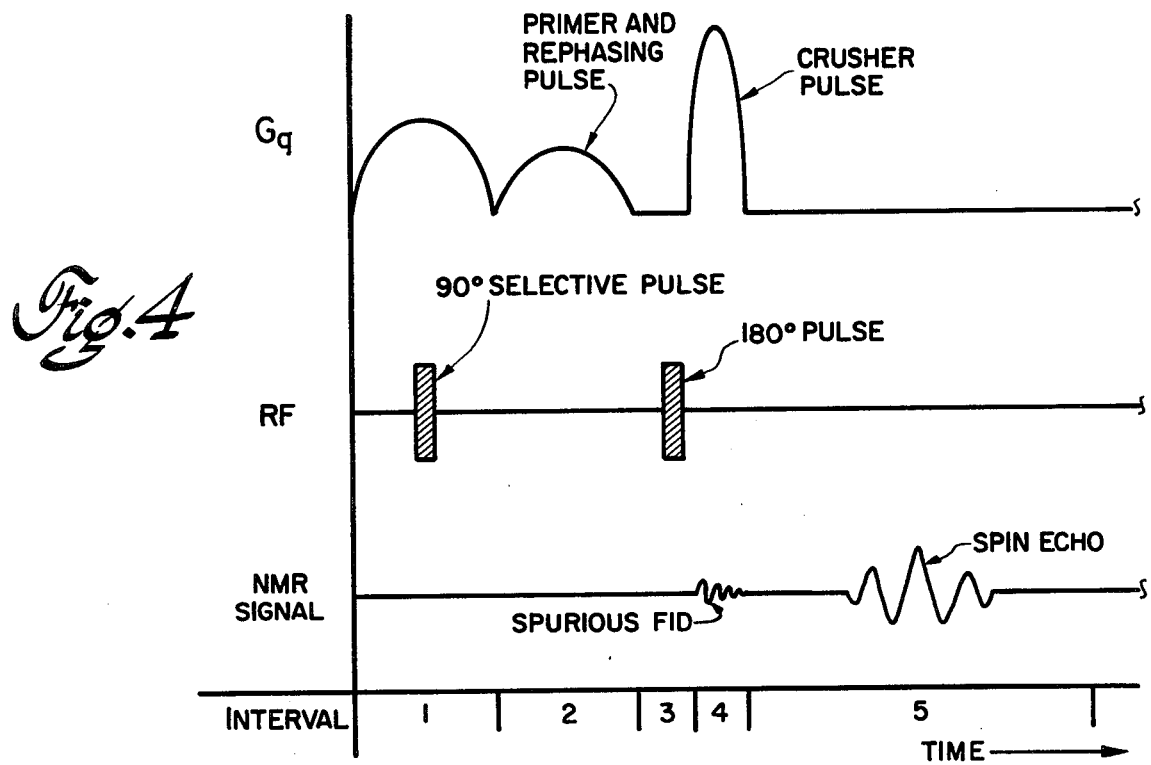
FIG. 4 depicts a pulse sequence incorporating the invention and which is useful in spin echo type refocusing RF pulse sequences.

Reference is now made to FIG. 4 which depicts generically the method of the invention useful in eliminating image artifacts caused by nonideal 180° RF pulses as applied to NMR pulse sequences producing spin echo signals. A thin planar slice of resonant nuclear spins is selectively excited during interval 1, as previously described, by the application of a selective 90° RF pulse in the presence of a positive magnetic field gradient $G_q$, where $G_q = \partial B_o / \partial q$, and q is the axis normal to the planar slice. Next, during interval 2 a second magnetic field gradient pulse is applied which is the sum of two linearly independent components. The first component is the rephasing component substantially identical to the negative $G_z$ gradient applied in interval 2 of FIG. 3, as previously described. The second component, termed a "primer" pulse, is a high amplitude, short duration magnetic field gradient pulse. The application of the primer and rephasing pulse in interval 2 (FIG. 4) is followed in interval 3 by the application of a 180° RF pulse and in interval 4 by the application of a magnetic field gradient pulse termed the "crusher" pulse. The primer and crusher pulses are employed to destroy all FID during interval 5. A spin echo signal occurs in interval 5.

The 180° RF pulse can be either selective or nonselective. The crusher pulse, in order to destroy all FID during the data acquisition interval 5, must have a large amplitude, typically on the order of 1 to 10 gauss/cm. Moreover, the pulse must be kept as short as possible so as not to interfere with the data acquisition interval 5. In general, the duration of the pulse should be between 0.1 and 5 milliseconds. In this manner, the spurious FID which occurs in interval 4, as shown, does not appear in interval 5 when imaging data is collected.

The relationships between the $G_q$ gradient in interval 1, the primer and rephasing pulse in interval 2, and the crusher pulse in interval 4 may be expressed as the integral sum $$\int_2 G_q dt = \int_4 G_q dt - \frac{1}{2}\int_1 G_q dt. \qquad (10)$$

It is apparent from equation (10) that the integrals of the crusher and primer pulses are the same. It should be noted that the gradient upon which the crusher pulse is applied need not be perpendicular to the imaging plane, which corresponds to the plane of thin planar slice 105 (FIG. 1). Thus, for example, the crusher pulse could be applied upon either the $G_x$ or the $G_y$ gradients shown in FIG. 3 or FIGS. 6–8. Generally, it is desirable to select a gradient having a direction in which most of the sample is distributed. For example, when the human body is selected as the imaging sample, the long axis of the the body is frequently selected to coincide with the direction of the Z-axis. In this case, it is most advantageous to apply the crusher pulse upon the $G_z$ gradient.

The effect of the primer pulse applied in interval 2 of FIG. 4 is to dephase nuclear spins situated in thin planar slice 105 (FIG. 1), selected in interval 1 (FIG. 4), as well as those nuclear spins situated outside the thin planar slice. The 180° RF pulse applied in interval 3 has a two-fold effect. That component of the 180° RF pulse which is exactly 180° ("perfect") inverts the nuclear spins, while the effect of the "imperfect" component having a 90° contribution rotates the nuclear spins into the transverse plane. The nuclear spins rotated into the transverse plane would ordinarily produce the spurious FID signal which would interfere with the data collection process. This spurious FID is, however, greatly attenuated by the application of the crusher pulse in interval 4 following the application of the 180° RF pulse. The crusher pulse has an integral with respect to time equal to that of the primer pulse, so that the nuclear spins dephased by the primer pulse and inverted by the perfect component of the 180° RF pulse are rephased by the crusher pulse and produce the desired spin echo signal in interval 5. The nuclear spins rotated into the transverse plane are rapidly dephased so that the spurious FID is shortened, as shown in FIG. 4, and hence does not interfere in the data collection interval.

In NMR pulse sequences that employ 180° RF pulses, but not for the purpose of rephasing of the nuclear spins, the primer pulse is unnecessary. The crusher pulse applied immediately after the 180° RF pulse rapidly dephases the nuclear spins so that a spurious FID signal does not occur during the data collecting period.

The magnitudes of the primer and crusher pulses should be made as large as the NMR system components allow. For example, the magnitude may be on the order of 0.5 to 10 gauss/cm. A magnitude of 0.5 gauss/cm was found sufficient to eliminate artifacts in image 105b depicted in FIG. 2. This compares to a magnitude of about 0.1 gauss/cm for the $G_z$ gradient in interval 1 of FIG. 6 and a magnitude of about 1200 gauss for static magnetic field $B_o$.

Figure 5:
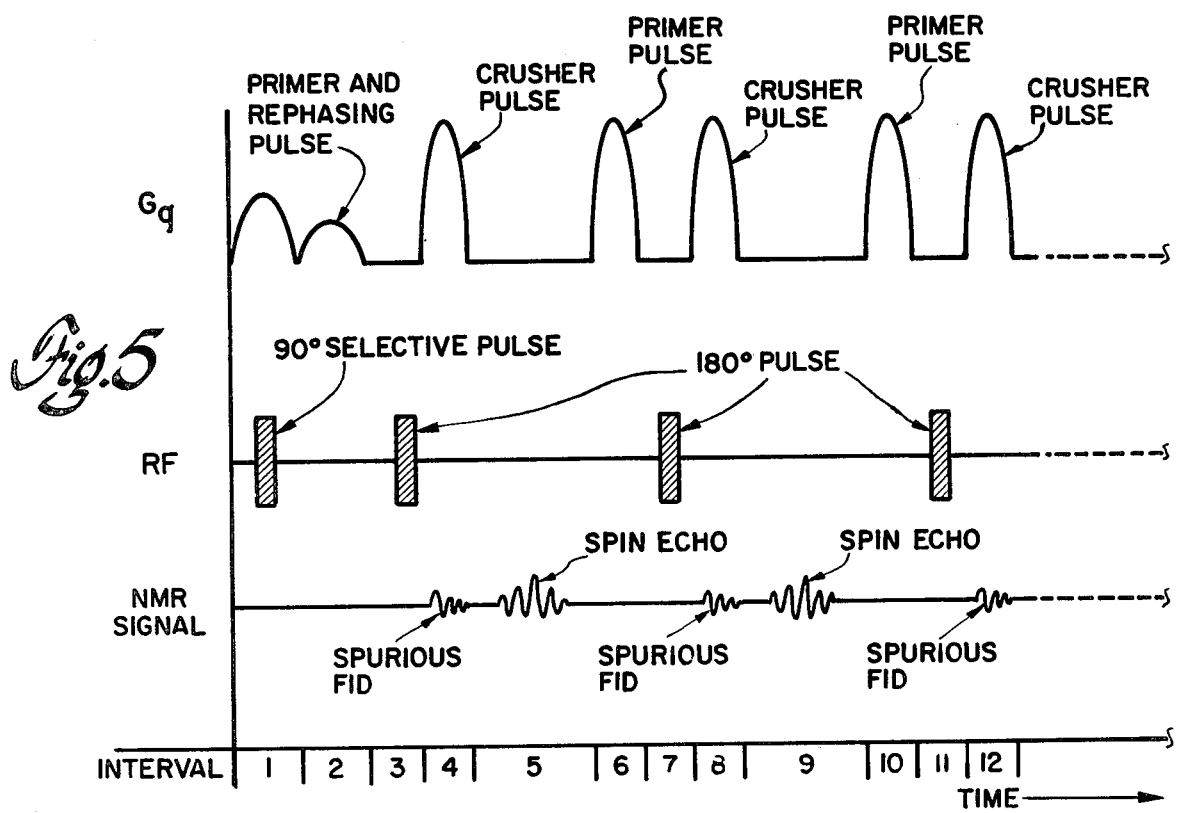
FIG. 5 depicts a pulse sequence similar to that of FIG. 4, but which illustrates the application of the invention to multiple spin echo type sequences.
Figure 8:
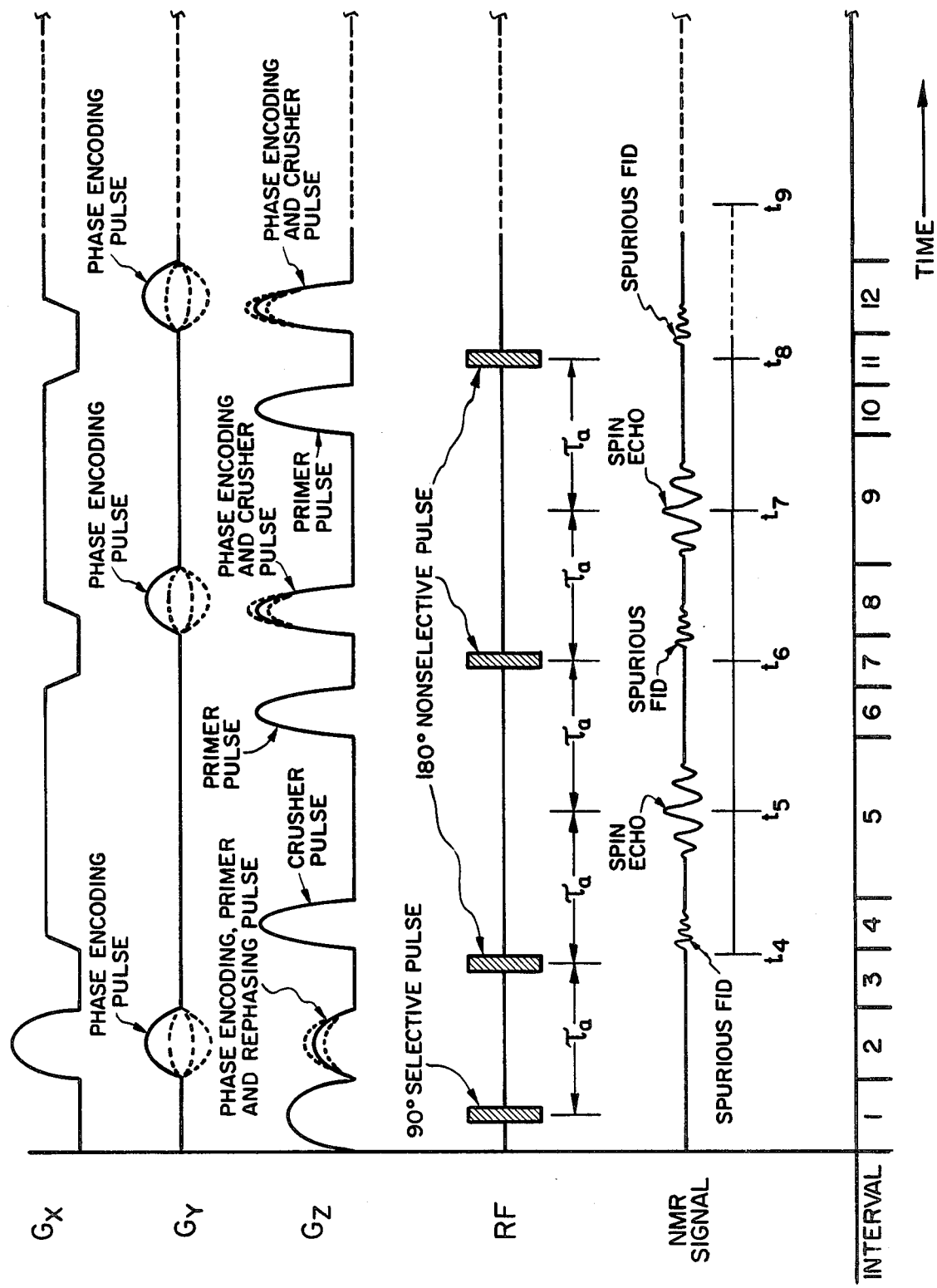
FIG. 8 depicts a pulse sequence which illustrates the application of the invention to an NMR imaging pulse sequence using multiple spin-echoes.

FIG. 5 depicts a pulse sequence in which multiple 180° RF pulses are used to generate multiple spin echo signals. The 180° RF pulses can be either selective or nonselective. Intervals 1–5, shown on the horizontal axis of FIG. 5, correspond to like numbered intervals of FIG. 4. In addition, in the pulse sequence of FIG. 5, 180° RF pulses are applied in intervals 7 and 11, etc., so as to produce spin echo signals in subsequent intervals, such as the spin echo signal in interval 9 produced by the 180° RF pulse applied in interval 7. Each of the 180° RF pulses in intervals 7 and 11 is preceded by a primer pulse in intervals 6 and 10, respectively. These 180° RF pulses are followed by crusher pulses in intervals 8 and 12, which, in the manner described hereintofore, shorten the spurious FID signals. The integral with respect to time of the wave form of the primer pulse is equal to that of the crusher pulse, so that the $i^{th}$ 180° RF pulse $$\int_{t_i-} G_q dt = \int_{t_i+} G_q dt, \qquad (11)$$

where $t_i+$ is the duration of the crusher pulse following the 180° RF pulse, and $t_i-$ is the duration of the primer pulse preceding it. An example of an NMR imaging pulse sequence using multiple 180° RF pulses is shown in FIG. 8 which will be discussed hereinafter.

Figure 6:
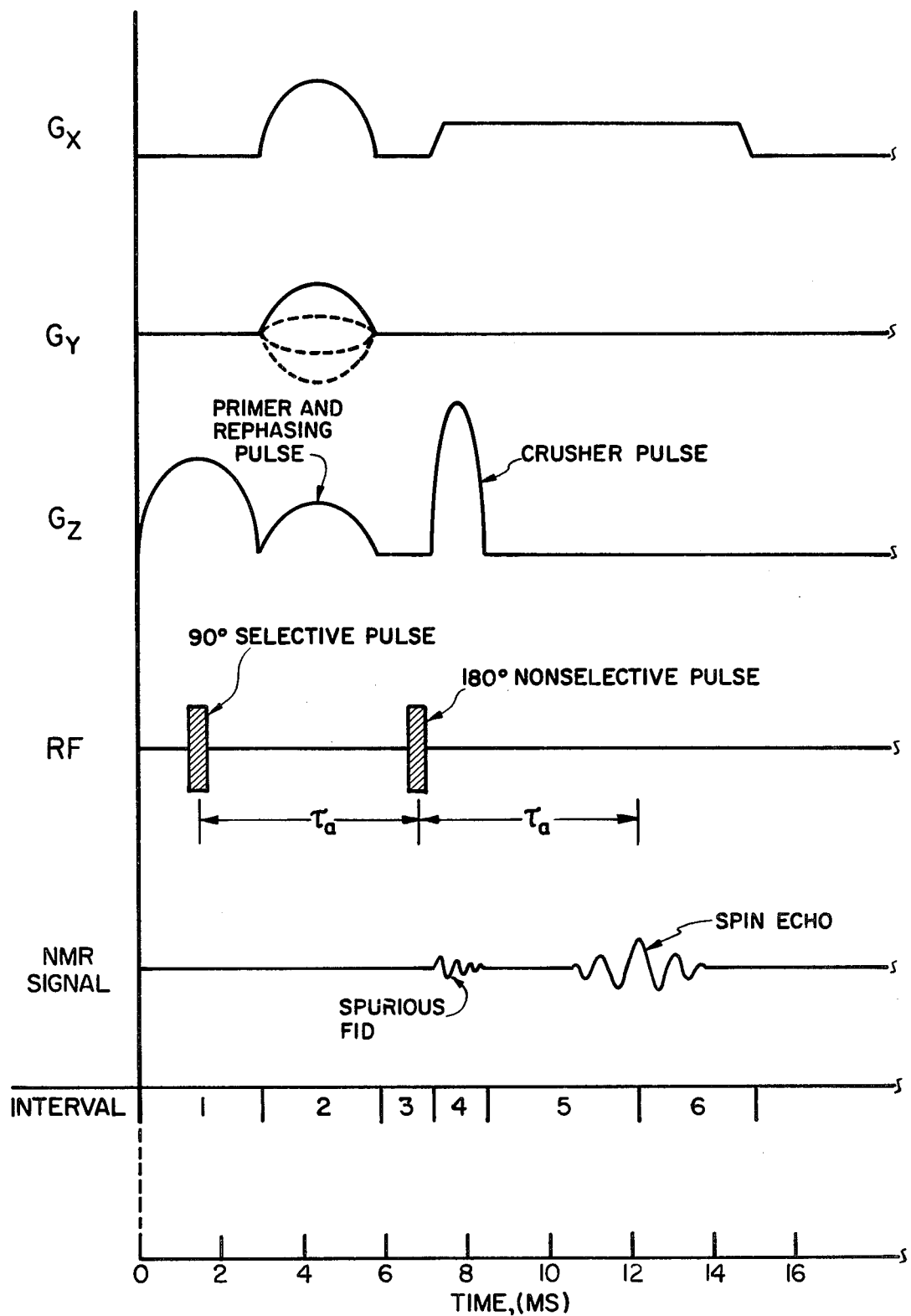
FIG. 6 illustrates an NMR imaging pulse sequence incorporating the invention and which was used to produce the imaging data for constructing image 105b shown in FIG. 2.
Figure 7:
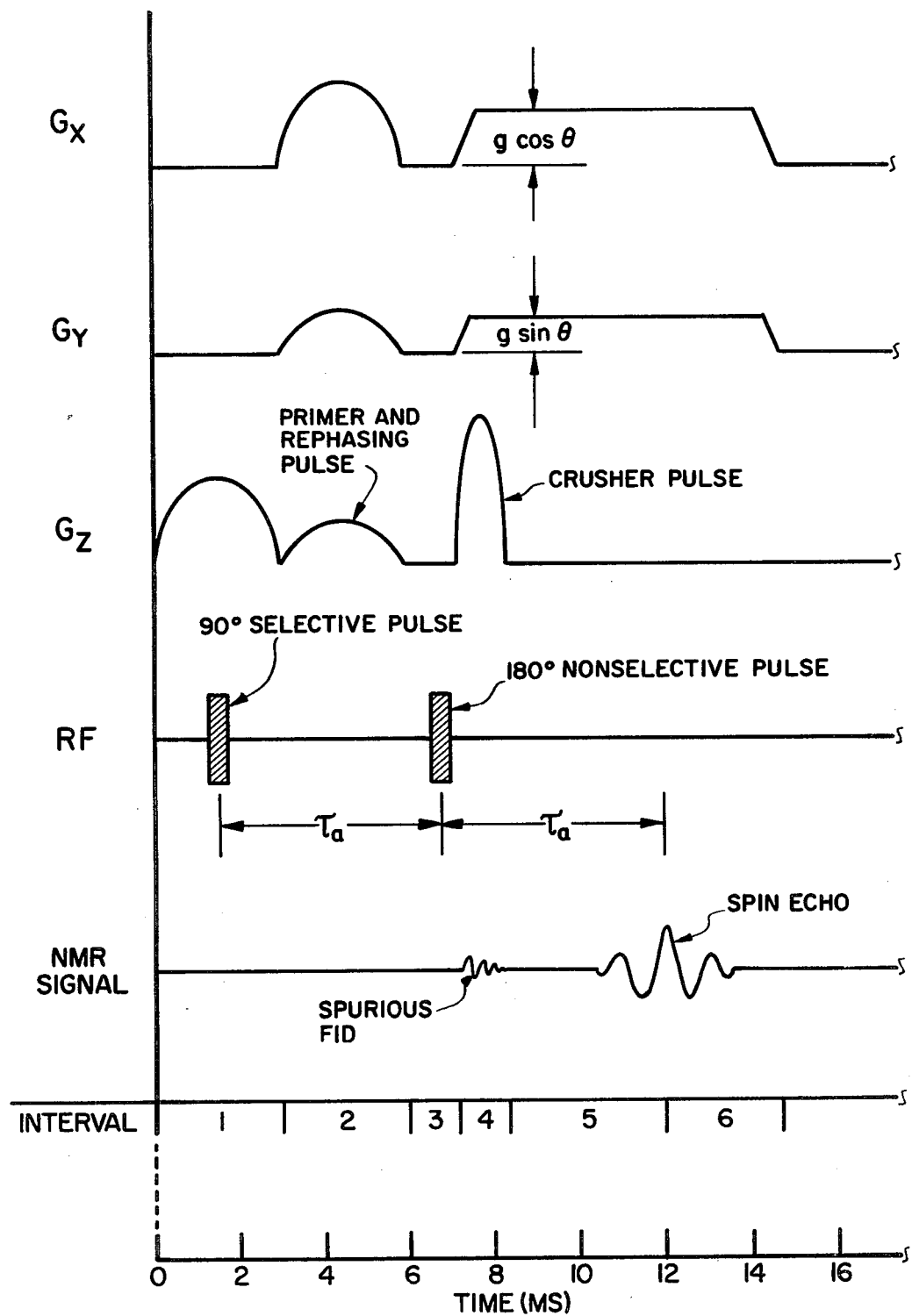
FIG. 7 depicts a pulse sequence which illustrates the application of the invention to a multiple angle projection reconstruction NMR imaging pulse sequence.

Exemplary applications of the pulse sequence shown in FIG. 4 are provided in FIGS. 6 and 7. FIG. 6 is similar to FIG. 3, previously discussed, with the notable exception that in interval 2 of FIG. 6, the $G_z$ gradient comprises a primer and rephasing pulse. In addition, in interval 4, immediately following the application of 180° pulse in interval 3, the $G_z$ gradient includes a crusher pulse. Typical timing of the pulse sequence is shown on the time scale parallel to the horizontal interval axis.

FIG. 7 depicts an NMR imaging pulse sequence used to obtain the imaging data by multiple angle projection reconstruction. In this pulse sequence, the manner in which the effect of the spurious FID NMR signal is eliminated is similar to that depicted in FIG. 6. Thus, the 180° RF pulse in interval 3 is preceded by a primer and rephasing pulse in interval 2, and followed by a crusher gradient pulse in interval 4. These pulses are applied upon the $G_z$ magnetic field gradient. The various pulses shown in FIGS. 6 and 7 are related and defined by equation (10) in which $G_z$ would be substituted for $G_q$.

In addition, the respective integrals with respect to time of the waveforms of the $G_x$ and $G_y$ gradients are selected such that $$\int_2 G_x dt = \int_{4 \text{ and } 5} G_x dt, \qquad (12)$$

$$\int_2 G_y dt = \int_{4 \text{ and } 5} G_y dt, \qquad (13)$$

This ensures that the nuclear spins rephase at a time interval $\tau_a$ following the mean application of the 180° RF pulse in interval 3. In this manner, the effects of the inherent inhomogeneities in the static magnetic field on the spin echo in interval 5 are overcome.

Imaging information using the pulse sequence of FIG. 7 is obtained by observing the spin echo signal in the presence of imaging gradients $G_x$ and $G_y$ directed in the X- and Y-axis directions, respectively. The magnitudes of the $G_x$ and $G_y$ gradients are constant in intervals 4–6 for each value of $\theta$ which is the angle of a single projection. However, as the projection angle is changed, the new gradient magnitudes are given by $G_x = g \cos \theta$ and $G_y = g \sin \theta$, respectively, in which $\theta$ is the angle of a single projection during intervals 4–6 and g is a constant. The spin-echo signal is observed in the presence of a magnetic field gradient which is the sum of $G_x$ and $G_y$ gradient fields. The $G_x$ and $G_y$ field gradients add vectorially to produce a resultant radial gradient in the imaging plane at angle $\theta$. Spatial information from the entire plane is encoded in the direction of the radial gradient. In order to obtain sufficient information to image the entire planar section 105, (FIG. 1) multiple projections are obtained by changing projection angle $\theta$ at, for example, 1° intervals to collect spatial data from at least 180 projections in a 180° arc. Fourier transformation of the signal corresponding to each projection provides the spatial distribution of the NMR signal in that direction. The image is reconstructed from all of the projections using a known computer reconstruction algorithms.

FIG. 8 depicts an NMR pulse sequence utilizing the concept described in conjunction with FIG. 5 to eliminate the effects of spurious FID signals caused by the use of multiple 180° RF pulses. The pulse sequence is used to simultaneously collect three-dimensional imaging information necessary to produce a series of tomographic section images corresponding to thinner planar slices 104 and 105 of a thick planar slab 102, as shown in FIG. 1.

A method of three-dimensional NMR imaging using selective excitation has been described and claimed in application Ser. No. 365,229, filed Apr. 5, 1982 by the same inventors as herein and assigned to the same assignee as the present invention. This application is incorporated herein by reference.

As has been previously described with respect to FIG. 5, the effects of spurious FID signals are eliminated by the application of primer and crusher pulses immediately before and after each of the 180° RF pulses. The first primer pulse occurs in interval 2 and is combined with the negative rephasing $G_z$ gradient pulse and a phase encoding pulse. Crusher pulses area applied in intervals 4, 8, 12, . . . etc., while primer pulses are applied in intervals 6, 10, . . . etc. The crusher pulses in intervals 8, 12, etc. have superimposed thereon phase encoding gradient pulses, as indicated by the dashed lines, for phase encoding spatial information in the Z-axis direction. Additional 180° RF pulses, and primer and crusher pulses, may be applied in time intervals subsequent to interval 12 until the spin-echo signals become significantly attenuated because of $T_2$ decay, ($T_2$ being a measure of how long excited nuclear spins oscillate in phase; i.e., $T_2$ is the "spin-spin" or "transverse" relaxation time).

The manner in which the pulse sequence depicted in FIG. 8 may be used to obtain imaging information will be better understood if reference is made to FIG. 1. Initially, in interval 1 a positive $G_z$ gradient is applied and imaging sample 100 is irradiated with a selective 90° RF pulse having a frequency bandwidth sufficient to preferentially excite nuclear spins in thick planar slab 102. The 90° RF pulse is preferably a carrier amplitude modulated by a signal of waveform (sin bt)/bt, in which t is time and b is a constant, so that planar slab 102 has a substantially rectangular profile. Other frequency selective 90° RF pulses may be used, provided the resulting thick planar slab has a rectangular profile. The frequency bandwidth of the 90° pulse is determined by the number of tomographic section images 104 and 105 that are desired.

In interval 2, a dephasing magnetic field gradient $G_x$ is applied to dephase the nuclear spins by a predetermined amount, so that when the nuclear spins are inverted by a 180° RF pulse applied in interval 3, a spin echo signal is produced at interval 5 at a time interval $\tau_a$ following the mean application of the 180° RF pulse, as previously described with reference to FIG. 3.

Contemporaneously with the application of the $G_x$ dephasing magnetic field gradient pulse in interval 2, a $G_y$ phase encoding magnetic field gradient pulse having one of $n_y$ different amplitudes (as indicated by the dashed lines) is also applied. The $G_y$ gradient encodes spatial information in the Y-axis direction by introducing a twist in the orientation of the nuclear spins as previously described. The number, $n_y$, of $G_y$ gradient amplitudes is chosen to be equal to the number of pixels the reconstructed tomographic section image will have in the Y-axis direction. The $G_y$ pulses are repeated for $n_y$ different gradient amplitudes to produce $n_y$ spin echo signals. In practice, signals are averaged several times prior to advancing the $G_y$ gradient in order to improve the signal-to-noise ratio. Typically, $n_y$ is 128 or 256.

The $G_z$ magnetic field gradient interval 2 is the sum of three components. The first component is a negative rephasing pulse, as previously described, and which is related to the $G_z$ pulse interval 1 as defined in equation (8). The second component of gradient $G_z$ in interval 2 is a phase encoding pulse which makes it possible to phase encode spatial information throughout the thickness of slice 102 (i.e., in the Z-axis direction, FIG. 1), while the third component is a primer pulse, as previously described.

The $G_z$ magnetic field gradient is shown in interval 4 as a single $G_z$ pulse because the action of the individual components is linearly independent and therefore can be added to form a sum which performs the rephasing, phase-encoding, and primer actions simultaneously. The amplitude of magnetic field gradient $G_z$ is maintained constant while magnetic field gradient $G_y$ is advanced through $n_y$ amplitudes. Following the observation of $n_y$ spin echo signals, the phase encoding $G_z$ gradient is advanced and the $G_y$ gradient again sequenced through $n_y$ amplitudes. The number of amplitudes of the $G_z$ gradient, $n_z$, is equal to the number of tomographic sections 104 and 105 (FIG. 1). The number of spin echo signals required to obtain the spatial information necessary for $n_z$ section images is $(n_y) \cdot (n_z)$.

Spatial discrimination in the X-axis direction is provided by observing the spin echo signal in interval 5 in the presence of an imaging $G_x$ magnetic field gradient. The spin echo signal is sampled $n_x$ times in interval 5, (and in subsequent interval 9), wherein $n_x$ is equal to the number of pixels the tomographic section image has in the X-axis direction (typically, $n_x = n_y$). Upon Fourier transformation, the observed spin echo signal represents a projection of spatial information from throughout the entire thick slab 102 onto the X-axis.

Thus, thick slab 102 is divided into $n_x \cdot n_y \cdot n_z$ pixels which are obtained by known three-dimensional discrete Fourier transform techniques. The $n_x \cdot n_y \cdot n_z$ pixels, once obtained, can be displayed as planar images at any angle through the thick planar slab.

The multiple 180° RF pulses in intervals 7, 11, etc., and the spin-echo signals resulting therefrom can be used to either improve the signal-to-noise ratio, or to shorten the data collection time.

Improvement in the signal-to-noise ratio can be realized (without applying the phase encoding gradients $G_y$ and $G_z$ in intervals 8, 12, etc.) by simply adding up the spin echoes (produced by the 180° RF pulses) in intervals 5, 9, etc., taking care to time-reverse alternate echoes before adding, to improve the signal-to-noise ratio. If n echoes are gathered, then the signal-to-noise ratio will be improved by a factor of approximately $\sqrt{n}$ up to the point where the echo signals become significantly attenuated because of $T_2$ decay.

The $G_y$ and $G_z$ phase encoding gradients in intervals 8, 12, etc., can be used to shorten the data collection time. In order to obtain the necessary spatial information to produce an image with $n_x \cdot n_y \cdot n_z$ pixels, it is necessary to gather at least $n_y \cdot n_z$ signals. Each of these signals must correspond to a unique pair of integers, for example, $k_y$, $k_z$, such that $$-\frac{n_y}{2} \leq k_y \leq \frac{n_y}{2} - 1, -\frac{n_z}{2} \leq k_z \leq \frac{n_z}{2} - 1 \qquad (14)$$

and $$S(x,y,z,k_y,k_z,t) = S(x,y,z,0,0,t) \exp i\, \phi_y \exp i\, \phi_z \qquad (15)$$

where $S(x,y,z,k_y,k_z,t)$ is the NMR signal originating from the image sample at point $(x,y,z)$ characterized by integers $k_y$, $k_z$ with $$\phi_y = \frac{2\pi k_y y}{L_y}, \phi_z = \frac{2\pi k_z z}{L_z}. \qquad (16)$$

In equation 15 and 16 i denotes $\sqrt{-1}$, and $\phi_y$ and $\phi_z$ denote the phase shift of the signal in the Y- and Z-axis directions, respectively. $L_y$ and $L_z$ are the lengths of the imaging aperture in the Y- and Z-axis directions, respectively.

If only the pulse sequence comprising intervals 1–5 were to be used, then each pulse sequence would produce only one contribution $k_y, k_z$ and thus $n_y \cdot n_z$ such sequences would have to be used. This takes time $n_y \cdot n_z \cdot \tau$, where $\tau$ is the time between pulse sequences (typically 0.05 sec to 1 sec). If on the other hand, there are m echoes per excitation, then it is only necessary to perform $n_y \cdot n_z / m$ such sequences to get the full spatial imaging information.

An example of a sequence which gathers all the required imaging information is as follows. In the first excitation, a gradient pulse $G_z$ is applied in interval 2 which includes a rephasing component $G_{z1}(t)$, and a phase encoding component $G_{z2}(t)$, and a primer pulse $G_{z3}(t)$. The $G_{z1}(t)$ component satisfies $$\int_2 G_{z1}(t)dt = -\tfrac{1}{2} \int_1 G_z dt, \qquad (17)$$

while $G_{z2}(t)$ satisfies $$\gamma L_z \int_2 dt G_{z2}(t) = -2\pi \cdot \frac{n_z}{2} \qquad (18)$$

where $\gamma$ is the gyromagnetic ratio. Also in interval 2 is a phase encoding y gradient $G_y(t)$ such that $$\gamma L_y \int_2 dt G_y(t) = -2\pi \cdot \frac{n_y}{2}. \qquad (19)$$

In subsequent intervals 8, 12, and so on, additional $G_y$ gradient pulses are applied such that $$\gamma L_y \int_2 dt G_y(t) = \gamma L_y \int_8 dt G_y(t) = \qquad (20)$$

-continued $$\gamma L_y \int_{12} dt G_y(t) = \ldots = 2\pi$$

In this example, no additional $G_z$ phase encoding gradient pulses are applied. However, primer and crusher pulses precede and follow, respectively, each of the 180° RF pulses applied in intervals 3, 7, 11, etc. If the crusher pulse in intervals 4, 8, 12, etc. is designated by $G_{z4}(t)$, then the primer and crusher pulses satisfy the condition that $$\int_2 G_{z3}(t)dt = \int_4 G_{z4}(t)dt = \int_6 G_{z3}(t)dt = \qquad (21)$$

$$\int_8 G_{z4}(t)dt \ldots \text{etc.}$$

It should be noted that the phase twists along the Y-axis for the multiple echoes are cumulative, i.e., after j of the additional gradient pulses, the total shift $\Delta \phi_y$ between the extreme ends of the imaging aperture in the Y-axis direction is given by $$\Delta \phi_y = -2\pi \frac{n_y}{2} + 2\pi j \qquad (22)$$

If $n_y$ echoes can be obtained, then the next excitation sequence is identical to the first except that the first $G_{z2}(t)$ is chosen to satisfy the condition $$\gamma L_z \int_2 dt G_{z2}(t) = \left(-\frac{n_z}{2} + 1\right) 2\pi \qquad (23)$$

and $n_z$ such sequences are then obtained to complete the gathering of the spatial information.

The $G_x$ gradient pulses must satisfy the condition $$\int_2 dt G_x = \int_{t_4}^{t_5} dt G_x, \int_{t_5}^{t_6} dt G_x = \int_{t_6}^{t_7} dt G_x, \qquad (24)$$

$$\int_{t_7}^{t_8} dt G_x = \int_{t_8}^{t_9} dt G_x \ldots \text{etc.}$$

It should be evident that there are a large number of choices of $G_y$ and $G_z$ pulses which can be used to produce the complete set of spatial information, including additional $G_z$ phase encoding pulses in intervals 8, 12, etc., of FIG. 8. The only requirement is that all pairs of total phase pair, $(\phi_y, \phi_z)$ produced by the $G_y$ and $G_z$ pulses satisfy $(\Delta \phi_y, \Delta \phi_z) = 2\pi(k_y, k_z)$, where $$k_y = -\frac{n_y}{2}, -\frac{n}{2} + 1, \ldots, \frac{n_y}{2} - 1, \qquad (25)$$

$$k_z = -\frac{n_z}{2}, -\frac{n_z}{2} + 1, \ldots, \frac{n_z}{2} - 1, \qquad (26)$$

are used in at least one signal.

Figure 9:
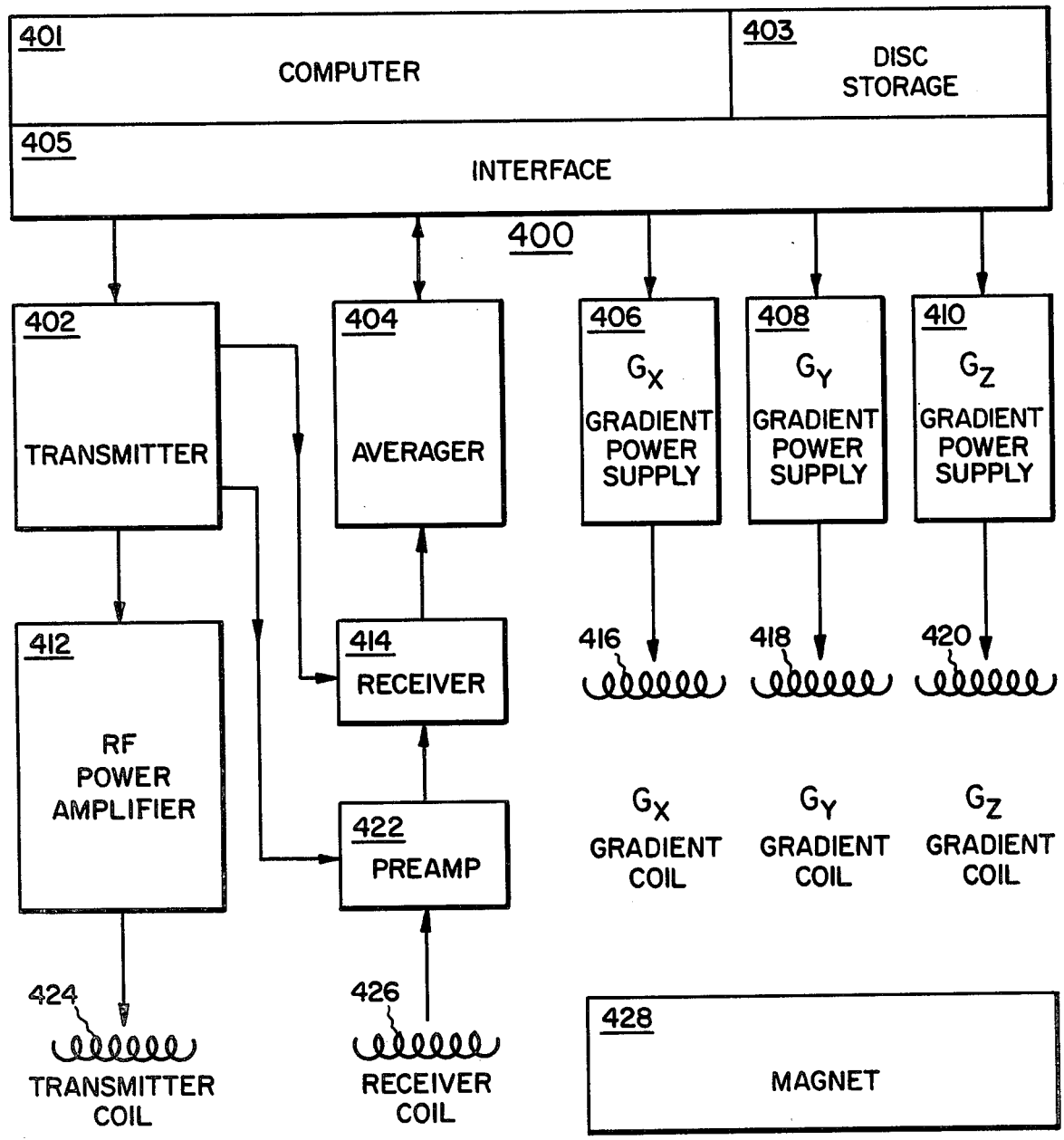
FIG. 9 illustrates a simplified block diagram of the major components of an NMR imaging apparatus suitable for producing the NMR pulse sequences shown in FIGS. 3–8.

FIG. 9 is a simplified block diagram of the major components of an NMR imaging system suitable for use with the NMR pulse sequences of the invention described herein. The system, generally designated 400, is made up of a general purpose mini-computer 401 which is functionally coupled to disk storage unit 403 and an interface unit 405. An RF transmitter 402, signal averager 404, and gradient power supplies 406, 408, and 410 for energizing, respectively, x, y, z gradient coils 416, 418, and 420 are coupled to computer 401 through interface unit 405.

RF transmitter 402 is gated with pulse envelopes from computer 401 to generate RF pulses having the required modulation to excite resonance in the object under study. The RF pulses are amplified in RF power amplifier 412 to levels varying from 100 watts to several kilowatts, depending on the imaging method, and applied to transmitter coil 424. The higher power levels are necessary for large sample volumes such as in whole body imaging, and where short duration pulses are required to excite large NMR frequency bandwidths.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for the NMR pulses, blanking for the preamplifier and RF power amplifier, and voltage waveforms for the gradient power supplies. The computer also performs data processing such as Fourier transforms, image reconstruction, data filtering, imaging display, and storage functions, all of which are operations conventionally performed by minicomputers and hence described herein only functionally (supra).

Figure 10A:
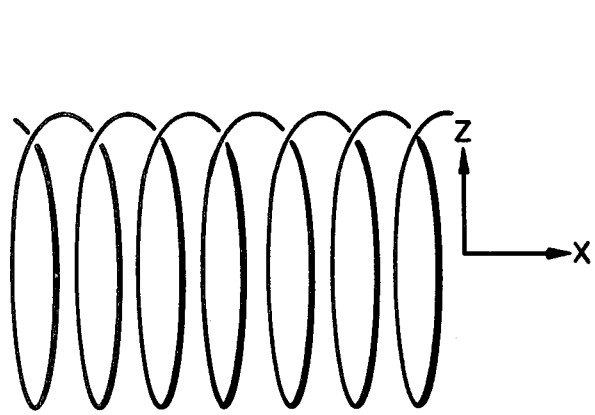
FIG. 10a illustrates an RF coil design for use with geometries for which the sample chamber is perpendicular to the static magnetic field.
Figure 10B:
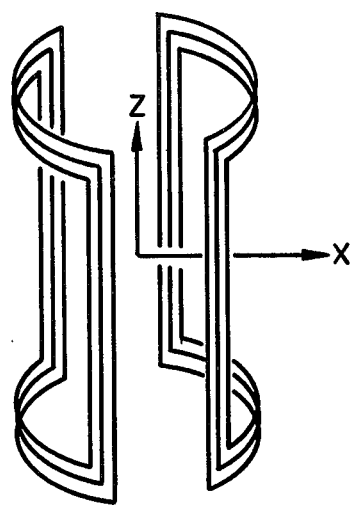
FIGS. 10b and 10c illustrate an RF coil design suitable for magnetic geometries for which the axis of the sample chamber is parallel to the static magnetic field.
Figure 10C:
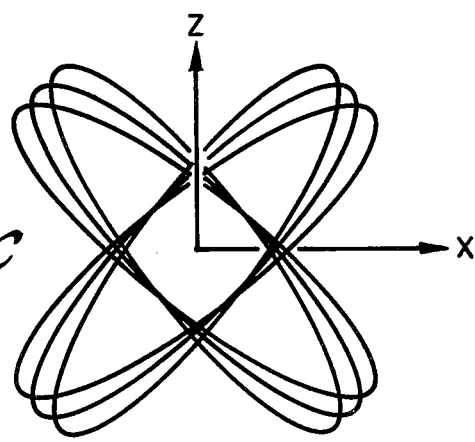

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the fields of the coils are orthogonal to the direction of the static magnetic field $B_o$ produced by magnet 428 (FIG. 9). The coils are isolated from the remainder of the system by enclosure in an RF shielded cage. Three typical RF coil designs are illustrated in FIGS. 10a, 10b, and 10c. All of these coils produce RF magnetic fields in the x direction. The coil designs illustrated in FIGS. 10b and 10c are suitable for magnetic geometries for which the axis of the sample chamber is parallel to the main field $B_o$ (FIG. 1). The design illustrated in FIG. 10a is applicable to geometries for which the sample chamber axis is perpendicular to the main field $B_o$ (not shown).

Magnetic field gradient coils 416, 418, and 420 (FIG. 9) are necessary to provide gradients $G_x$, $G_y$, and $G_z$, respectively. In the imaging pulse sequences described herein, the gradients should be monotonic and linear over the sample volume. Multi-valued gradient fields cause a degradation in the NMR signal data, known as aliasing, which leads to severe image artifacts. Nonlinear gradients cause geometric distortions of the image.

Figure 11A:
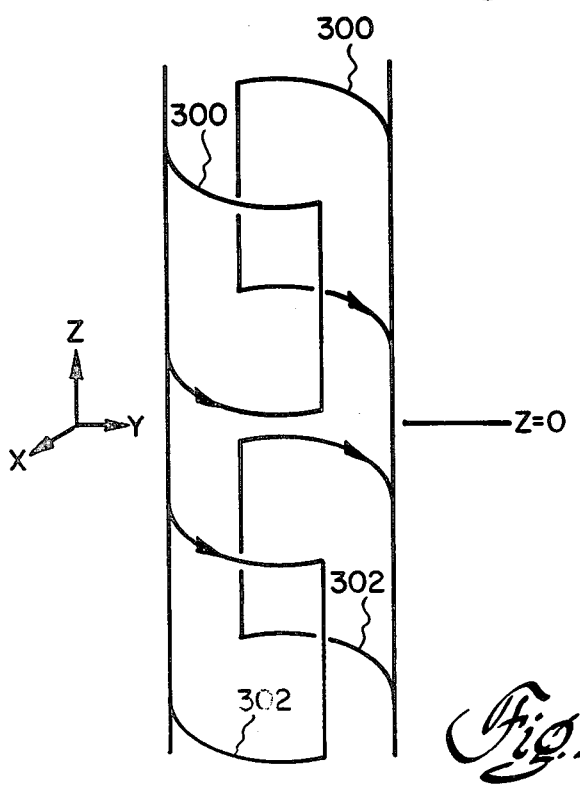
Fig. 11a illustrates two sets of coils suitable for producing $G_x$ and $G_y$ gradients.
Figure 11B:
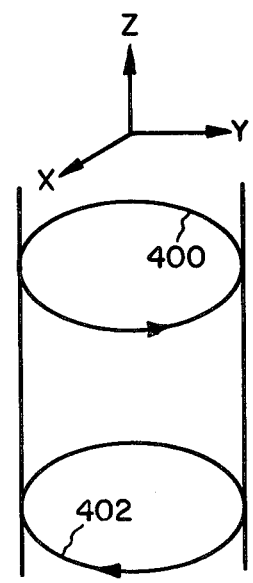
FIG. 11b depicts a coil configuration suitable for producing a $G_z$ gradient.

A design for gradient coils suitable for magnet geometries with a sample chamber axis parallel to the main field $B_o$ is depicted in FIGS. 11a and 11b. Each of gradients $G_x$ and $G_y$ is produced by a set of coils such as sets 300 and 302 depicted in FIG. 11a. The coil sets as illustrated in FIG. 11a produce gradient $G_x$. The coil sets for producing gradient $G_y$ are rotated 90° around the cylindrical axis 106 (FIG. 1) of the sample chamber relative to the coil that produces gradient $G_x$. The z gradient is generated by a coil pair such as coils 400 and 402 shown in FIG. 11b.

From the foregoing, it will be apparent that the NMR pulse sequences in accordance with the invention provide improved NMR methods which eliminate the effects of spurious FID signals produced by imperfect 180° RF pulses. Application of the invention to NMR imaging results in improved NMR pulse sequences which eliminate image artifacts due to the spurious FID signals.

While this invention has been and described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for overcoming the effects of a spurious FID NMR signal by shortening the duration thereof so as to avoid interference with the desired NMR signal, said method comprising sequentially the steps of:
   positioning the NMR sample in a static magnetic field;
   irradiating said NMR sample with a 180° RF pulse such that inherent imperfections in said 180° RF pulse cause a plurality of nuclear spins in said NMR sample to change orientation by an angle other than 180° relative to the direction of said magnetic field, said nuclear spins producing a net nuclear magnetization component transverse to the direction of said static magnetic field so as to induce a spurious FID signal in an NMR signal receiving coil upon termination of said 180° RF pulse; and
   applying a crusher magnetic field gradient pulse to said NMR sample so as to dephase said nuclear spins such that the duration of said spurious FID NMR signal is shortened, said crusher magnetic field pulse being applied to said NMR sample during at least a portion of the duration of said spurious FID NMR signal.

2. The method of claim 1 wherein said 180° RF pulse comprises a selective 180° RF pulse.

3. The method of claim 1 wherein said 180° RF pulse forms part of a spin echo NMR pulse sequence, and wherein said method further comprises the step of applying to said sample a primer magnetic field gradient pulse, prior to irradiating said NMR image sample with said 180° RF pulse, said primer pulse having the same direction and an equal integral with respect to time as said crusher pulse.

4. The method of claim 3 further comprising the step of irradiating said NMR sample, following the application of said crusher pulse, with at least one additional 180° RF pulse, and wherein said last-mentioned step of irradiating is preceded and followed by the step of applying primer and crusher magnetic field gradient pulses, respectively, said primer and crusher pulses having the same direction and equal integrals with respect to time.

5. A method for overcoming the effects of a spurious FID NMR signal by shortening the duration thereof so as to avoid interference with a desired NMR signal, said method comprising sequentially the steps of:
   a. positioning an NMR sample in a static magnetic field;
   b. selectively exciting, during a first predetermined time interval, a plurality of nuclear spins in a planar section of said NMR sample by irradiating said sample with a selective RF pulse in the presence of a first magnetic field gradient pulse;

c. applying, during a second predetermined time interval, a second magnetic field gradient pulse composed of rephasing and primer components;

d. irradiating said NMR sample with a 180° RF pulse so as to invert the orientation of said excited nuclear spins by 180°, whereupon inherent imperfections in said 180° pulse cause a plurality of nuclear spins in said NMR sample to change orientation by an angle other than 180° relative to the direction of said magnetic field so as to produce a nuclear magnetization component transverse to the direction of said static magnetic field, such that said component induces a spurious FID signal in an NMR signal receiving means upon termination of said 180° RF pulse; and e. applying a crusher magnetic field gradient pulse, during a third time interval which includes at least a portion of the duration of said spurious FID signal, and following said step of irradiating, so as to dephase said nuclear spins producing said net nuclear magnetization component such that the duration of said spurious FID signal is shortened and does not interfere with the NMR signal produced by those of said excited nuclear spins that are reoriented by 180°.

6. The method of claim 5 wherein said first, second, and crusher magnetic field gradient pulses are related as defined by the equation $$\int_2 G_q dt = \int_3 G_q dt - \tfrac{1}{2} \int_1 G_q dt,$$

wherein $\int_1$, $\int_2$, and $\int_3$ denote, respectively, the integrals with respect to time of said first, second, and crusher magnetic field gradients over said first, second, and third time intervals, respectively, and wherein said magnetic field gradients have the same direction q and are each denoted by $G_q$.

7. The method of claim 5 or 6 wherein said direction q is along an axis orthogonal to said planar section of selectively excited nuclear spins.

8. The method of claim 5 further comprising the step of irradiating said NMR sample, following the application of said crusher magnetic field gradient pulse, with at least one additional 180° RF pulse, said last-mentioned step of irradiating being preceded and followed by the step of applying primer and crusher magnetic field gradient pulses having the same direction and equal integrals with respect to time.

9. The method of claim 5 wherein said selective RF pulse comprises a 90° RF pulse.

10. The method of claim 9 wherein said 90° RF pulse comprises RF carrier amplitude modulated by a signal of waveform (sin bt)/bt, wherein b is a constant and t is time.

11. The method of claim 9 wherein said 90° RF pulse comprises a Gaussian amplitude modulated carrier.

12. A method which overcomes the effects of inherent static magnetic field inhomogeneity on NMR spin echo formation and which overcomes the effects of a spurious FID NMR signal by shortening the duration thereof so as to avoid interference with a desired NMR spin echo signal, said method comprising sequentially the steps of:

a. maintaining a static magnetic field along a first axis of an NMR imaging sample;

b. selectively exciting, during a first predetermined time interval, a first plurality of nuclear spins in a planar section of said imaging sample by irradiating said imaging sample with a selective RF pulse in the presence of a first magnetic field gradient pulse;

c. applying for a second predetermined time interval:
 (1) a dephasing magnetic field gradient pulse along a second axis of said imaging sample to dephase said excited nuclear spins, said dephasing being in addition to nuclear spin dephasing induced by inherent inhomogeneities in said static magnetic field, and
 (2) a third magnetic field gradient pulse composed of a rephasing and primer magnetic field component along a third axis of said imaging sample;

d. irradiating said imaging sample with a 180° RF pulse during a third time interval following a time period $\tau_a$ subsequent to the mean occurrence of said selective RF pulse, so as to initiate the rephasing of said excited nuclear spins, whereupon any inherent imperfections in said 180° RF pulse cause a plurality of nuclear spins in said imaging sample to change orientation by an angle other than 180° relative to the direction of said static magnetic field, said last-mentioned nuclear spins producing a net nuclear magnetization component, transverse to the direction of said static magnetic field, which induces a spurious FID NMR signal in an NMR signal receiving means upon termination of said 180° RF pulse;

e. applying a crusher magnetic field gradient during a fourth predetermined time interval, so as to dephase said nuclear spins producing said spurious FID such that the duration of said FID signal is shortened, and so as to reverse the dephasing effect of said primer dephasing component of said third magnetic field gradient;

f. applying, during a fifth predetermined time interval, at least one imaging gradient having the same direction as said dephasing gradient in step c(1) such that, after a period of time equal to said period $\tau_a$ following said 180° RF pulse, the nuclear spin echo caused by rephasing of the nuclear spins dephased by said last-mentioned dephasing gradient coincides with the occurrence of the nuclear spin echo derived from the rephasing of the nuclear spins dephased by the inherent inhomogeneities in said static magnetic field, said nuclear spin echoes producing a composite NMR spin echo signal at a time subsequent to the occurrence of said spurious FID signal; and g. sampling said composite NMR spin echo signal in the presence of said imaging gradient.

13. The method of claim 12 wherein said selective RF pulse comprises a 90° RF pulse.

14. The method of claim 12 wherein said frequency selective pulse comprises a carrier modulated by a signal of waveform (sin bt)/bt, wherein b is a constant and t is time.

15. The method of claim 12 wherein said 90° RF pulse comprises a Gaussian amplitude modulated carrier.

16. The method of claim 12 wherein said planar section is situated orthogonal to said first axis of said sample.

17. The method of claim 12 wherein said dephasing gradient in step c(1) is a resultant dephasing gradient of the vectorial addition of two constituent dephasing gradients which are mutually orthogonal and which are coplanar with said planar section, said resultant dephasing gradient having a predetermined direction.

18. The method of claim 16 wherein said imaging gradient in step (f) is a resultant imaging gradient of the vectorial addition of two constituent imaging gradients which are mutually orthogonal and which are coplanar with said planar section, said constituent imaging gradients having the same respective directions within said thin planar slab as said constituent dephasing gradients, said constituent imaging gradients being selected such that said resultant imaging gradient has the same predetermined direction as said resultant dephasing gradient.

19. The method of claim 18 wherein the integral of the waveform of said resultant dephasing gradient with respect to time over said first time interval is selected to be equal to the integral of the waveform of said resultant imaging gradient with respect to time over a time interval equal to said time period $\tau_a$.

20. The method of claim 18 wherein said resultant imaging gradient is selected to exhibit a constant amplitude during the step of sampling said composite NMR spin echo signal.

21. The method of claim 20 further comprising the step of repeating the sequence of steps (a–g) for different directions of said resultant dephasing and imaging gradients so as to cover, incrementally, at least a 180° arc within said thin planar slab.

22. The method of claim 12 wherein said dephasing gradient in step c(1) is the resultant of the vectorial addition of first and second mutually orthogonal gradients which are coplanar with said planar slice, said first orthogonal gradient being amplitude-adjustable for phase encoding nuclear spin information in the direction thereof.

23. The method of claim 22 wherein said imaging gradient is selected to have the same direction as said second orthogonal gradient.

24. The method of claim 23 wherein the integral of the waveform of said second orthogonal gradient with respect to time is selected to be equal to the integral of the waveform of said imaging gradient in step (f) with respect to time over a time interval equal to said time period $\tau_a$.

25. The method of claim 24 wherein said imaging gradient in step (f) is selected to have a constant amplitude during the step of sampling said composite NMR signal.

26. The method of claim 25 further comprising the step of repeating the sequence of steps (a–g) for different amplitude of said first orthogonal gradient.

27. A three-dimensional NMR imaging method in which the effects of spurious FID NMR signals are overcome by shortening the duration thereof so as to avoid interference with the desired NMR signal, and in which the necessary imaging information for constructing a series of tomographic section images of a thick planar slab of an NMR imaging sample is collected simultaneously from throughout said thick planar slab, said method comprising sequentially the steps of:

a. maintaining a static magnetic field along a first axis of said imaging sample;

b. selectively exciting, during a first predetermined time interval, a first plurality of nuclear spins in said thick planar slab by irradiating said imaging sample with a selective RF pulse, in the presence of a first magnetic field gradient pulse;

c. applying for a second predetermined time interval:
   (1) a second magnetic field gradient pulse along a second axis of said imaging sample so as to dephase said excited nuclear spins,
   (2) a third magnetic field gradient directed along a third axis of said imaging sample for encoding nuclear spin spatial distribution information along said third axis, said third magnetic field gradient having a predetermined amplitude selected from $n_y$ different amplitudes, wherein $n_y$ is equal to the number of pixels in one of said tomographic section images along said third axis, and
   (3) a fourth magnetic field gradient pulse along said first axis, said fourth magnetic pulse having a first component for encoding nuclear spin spatial distribution information along said first axis, and a second component for rephasing excited nuclear spins in said thick planar slab dephased during step (b), and further including a primer pulse component for dephasing nuclear spins in said imaging sample, said first component having $n_z$ different amplitudes, wherein $n_z$ is selected to be equal to the number of said tomographic section images;

d. irradiating said imaging sample with a 180° RF pulse during a third predetermined time interval so as to initiate the rephasing of said excited nuclear spins, whereupon any inherent imperfections in said 180° RF pulse cause a plurality of nuclear spins in said imaging sample to change orientation by an angle other than 180° relative to the direction of said static magnetic field, said last-mentioned nuclear spins producing a net magnetization component, transverse to the direction of said static magnetic field, which induces a spurious FID signal in an NMR signal receiving means upon termination of said 180° RF pulse;

e. applying a crusher magnetic field gradient pulse during a fourth predetermined time interval so as to dephase said nuclear spins producing said spurious FID signal such that the dephasing effect of said primer pulse component of said fourth magnetic field gradient is reversed;

f. sampling $n_x$ times a first spin echo signal produced by the reversal of said excited nuclear spins by said 180° RF pulse in the presence of an imaging gradient directed along said second axis, said first spin echo signal occurring at a time subsequent to the occurrence of said spurious FID signal, wherein $n_x$ is selected to be equal to the number of pixels in said tomographic section images along said second axis;

g. irradiating said imaging sample with multiple 180° RF pulses so that each of said last-mentioned 180° pulses produces a spin echo signal, each of said multiple 180° RF pulses being preceded and followed by primer and crusher magnetic field gradient pulses, respectively, for shortening the spurious FID signals induced by inherent imperfections in said multiple 180° pulses, said primer and crusher pulses having the same direction and equal integrals with respect to time;

h. sampling each of said multiple spin echo signals $n_x$ times in the presence of said imaging gradient;

i. averaging said sampled spin echo signals, after time-reversing alternate ones thereof to improve the signal-to-noise ratio of said imaging information;

j. repeating steps (a–i) for each amplitude $n_y$ of said third magnetic field gradient; and k. repeating steps (a–j) for each amplitude $n_z$ of said phase-encoding component of said fourth magnetic field gradient.

28. The method of claim 27 wherein said selective RF pulse comprises a 90° RF pulse.

29. The method of claim 28 wherein said 90° RF pulse comprises an RF carrier amplitude modulated by a signal of (sin bt)/bt, wherein b is a constant and t is time.

30. A method for overcoming the effects of a spurious FID NMR signal by shortening the duration thereof so as to avoid interference with the desired NMR signal, said method comprising sequentially the steps of:

a. positioning an NMR sample in a static magnetic field;

b. exciting, during a first predetermined time interval, a plurality of nuclear spins in said NMR sample by irradiating said sample with an RF pulse;

c. applying during a second predetermined time interval, a second magnetic field gradient pulse having a primer magnetic field gradient component;

d. irradiating said NMR sample with a 180° RF pulse so as to invert the orientation of said excited nuclear spins by 180° whereupon inherent imperfections in said 180° RF pulse cause a plurality of nuclear spins in said NMR sample to change orientation by an angle other than 180° relative to the direction of said static magnetic field so as to produce a nuclear magnetization component transverse to the direction of said static magnetic field, such that said component induces a spurious FID signal in an NMR signal receiving means upon termination of said 180° RF pulse; and e. applying a crusher magnetic field gradient pulse, during a third time interval and following said step of irradiating, so as to dephase said nuclear spins producing said net nuclear magnetization component such that the duration of said spurious FID signal is shortened and does not interfere with the NMR signal produced by those of said excited nuclear spins that are reoriented by 180°.

31. The method of claim 30 wherein said step of exciting comprises the step of irradiating said sample with a selective RF pulse in the presence of a magnetic field gradient pulse.

32. The method of claim 31 wherein said selective RF pulse comprises a 90° RF pulse.

33. The method of claim 32 wherein said 90° RF pulse comprises RF carrier amplitude modulated by a signal of waveform (sin bt)/bt, wherein b is a constant and t is time.

34. The method of claim 32 wherein said 90° RF pulse comprises a Gaussian amplitude modulated carrier.

* * * * *